United States Patent [19]

Takemae

[11] Patent Number: 4,458,336
[45] Date of Patent: Jul. 3, 1984

[54] SEMICONDUCTOR MEMORY CIRCUIT

[75] Inventor: Yoshihiro Takemae, Yokohama, Japan

[73] Assignee: Fujitsu Limited, Kawasaki, Japan

[21] Appl. No.: 313,616

[22] Filed: Oct. 21, 1981

[30] Foreign Application Priority Data

Oct. 22, 1980 [JP] Japan .................................. 55-147771
Oct. 22, 1980 [JP] Japan .................................. 55-147773

[51] Int. Cl.³ .............................................. G11C 11/40
[52] U.S. Cl. ..................................... 365/149; 365/203
[58] Field of Search ............... 365/149, 154, 190, 202, 365/203, 205, 207, 222

[56] References Cited

U.S. PATENT DOCUMENTS

4,045,783  8/1977  Harland ................................. 365/149
4,195,357  3/1980  Kuo et al. ......................... 365/149 X
4,291,393  9/1981  Wilson ................................. 365/203

Primary Examiner—Joseph A. Popek
Attorney, Agent, or Firm—Staas & Halsey

[57] ABSTRACT

A semiconductor memory circuit is disclosed, which includes: word lines, bit lines and memory cells at each cross point of the word lines and the bit lines. Each memory cell including a capacitor, having a first electrode and a second electrode, and a transfer-gate transistor connected in series with the capacitor at the first electrode thereof. The memory circuit also includes pre-charge circuits each charging one corresponding bit line to a predetermined pre-charge voltage level by using a memory power source and sense amplifiers each amplifying the voltage level developed at one corresponding bit line so as to have a high voltage level or a low voltage level in accordance with the charge stored in each corresponding capacitor. Additionally included are a first circuit which supplies the pre-charge voltage to the pre-charge circuit, the level of the pre-charge voltage is in the middle between the high voltage level and the low voltage level, and a second circuit which supplies a predetermined voltage to the capacitor at its second electrode. Preferably the predetermined voltage supplied from the second circuit is same as the voltage supplied from the first circuit.

12 Claims, 15 Drawing Figures

Fig. 4 PRIOR ART ("1" Read)

Fig. 5 PRIOR ART

Fig. 6 PRIOR ART ("0" Read)

Fig. 7 PRIOR ART ("1" Read)

SEMICONDUCTOR MEMORY CIRCUIT

BACKGROUND OF THE INVENTION

The present invention relates to a semiconductor memory circuit and, more particularly, to a dynamic semiconductor memory circuit which employs rows and columns provided with so-called one transistor storage cells.

In recent years, the one-transistor storage cell type memory device has been widely utilized as a random access memory (RAM) device of the MIS integrated semiconductor memory circuit. Such RAM device has already been disclosed in U.S. Pat. No. 4,045,783 or U.S. Pat. No. 4,195,357, and produces many superior advantages, as compared with a conventional RAM, however, at the same time, such RAM has some defects. The present invention addresses two of the defects. One defect resides in that read data from the RAM often contains an error due to a change in the level of the voltage of power source. The other defect resides in that error in the RAM system often occurs due to a change in the level of the back gate voltage ($V_{BB}$) for biassing the substrate, in which the change of $V_{BB}$ is necessarily created in accordance with voltage change developed in the bit (column) line.

SUMMARY OF THE INVENTION

It is an object of the present invention to provide a semiconductor memory circuit which can overcome the aforementioned two defects simultaneously, although the two defects themselves have no similarity to each other.

A semiconductor memory circuit is disclosed, which includes word lines, bit lines and memory cells at each cross point of the word lines and the bit lines. Each memory cell including a capacitor, having a first electrode and a second electrode, and a transfer-gate transistor connected in series with the capacitor at the first electrode thereof. The memory circuit also includes pre-charge circuits each charging one corresponding bit line to a predetermined pre-charged voltage level by using a memory power source and sense amplifiers each amplifying the voltage level developed at one corresponding bit line, so as to have a high voltage level or a low voltage level in accordance with the charge stored in each corresponding capacitor. Additionally included are a first circuit which supplies the pre-charge voltage to the pre-charge circuit, the level of the pre-charge voltage is in the middle between the high voltage level and the low voltage level, and a second circuit which supplies a predetermined voltage to the capacitor at its second electrode. Preferably the predetermined voltage supplied from the second circuit is same as the voltage supplied from the first circuit.

The present invention will be more apparent from the ensuing description with reference to the accompanying drawings.

DESCRIPTION OF THE PREFERRED EMBODIMENTS

Figure 1:
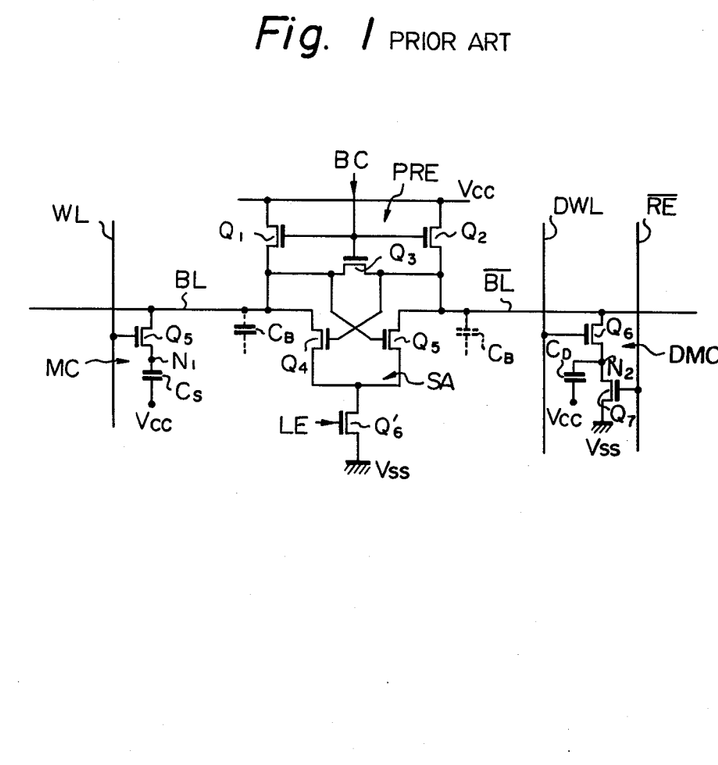
FIG. 1 illustrates a circuit diagram of a conventional one-transistor storage cell type RAM circuit.

FIG. 1 illustrates a circuit diagram of a conventional one-transistor storage cell type RAM circuit. The reference symbol SA represents a sense amplifier which consists of of MIS transistors $Q_4$, $Q_5$ and $Q'_6$ which is controlled by a signal LE. The reference symbols BL and $\overline{BL}$ represent a pair of bit lines which extend leftward and rightward respectively from the sense amplifier SA, the reference symbol PRE represents a pre-charge circuit consisting of MIS transistors $Q_1$ through $Q_3$, MC represents a memory cell consisting of MIS transistor $Q_5$, acting as a transfer-gate transistor and a MIS capacitor $C_S$, acting as a storage capacitor. The capacitor $C_S$ has a pair of electrodes, the first electrode thereof is connected, via a node $N_1$, to the transistor $Q_5$. The reference symbol DMC represents a dummy cell consisting of MIS transistors $Q_6$ and $Q_7$ and an MIS capacitor $C_D$. The reference symbol WL represents a word line. A signal, appearing on the word line WL, makes the transfer-gate transistor $Q_5$ ON and then the stored information in the memory cell MC is transferred to the bit line BL. The reference symbol DWL represents a dummy word line. A signal, appearing on the dummy word line DWL, makes the MIS transistor $Q_6$ ON and then the dummy capacitor $C_D$ is connected with the bit line $\overline{BL}$. The reference symbol $\overline{RE}$ indicates a signal which makes the transistor $Q_7$ ON so as to discharge the capacitor $C_D$. That is, the voltage level at the node $N_2$ is changed to the low voltage level of a memory power source, specifically the voltage level $V_{SS}$ which is usually 0 V. The reference symbol BC indicates a signal which makes MIS transistors $Q_1$, $Q_2$ and $Q_3$ ON simultaneously, so that the level of both bit lines BL and $\overline{BL}$ is changed to the high level of the memory power source, specifically the voltage level $V_{CC}$ which is usually 5 V. That is, the signal BC acts as a pre-charging signal. The bit lines BL and $\overline{BL}$ form the bit line parasitic capacitor $C_B$. Said high voltage level $V_{CC}$ of the memory power source is also applied to each one of the electrodes of the capacitors $C_S$ and $C_D$.

Figure 2:
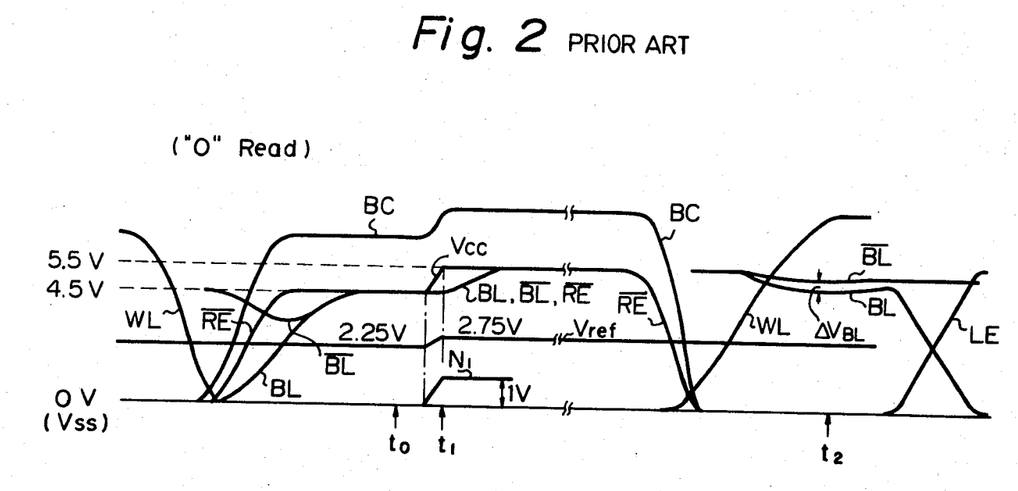
FIG. 2 is a graph, used for explaining the operation of the circuit illustrated in FIG. 1.

FIG. 2 depicts a graph, used for explaining the operation of the circuit shown in FIG. 1. The graph of FIG. 2 indicates the operation when information "0" is read out of the memory cell MC. The level of the word line WL is changed to the low voltage level $V_{SS}$ after a write operation or a refresh operation has been finished. Then the signals BC and $\overline{RE}$ are activated. Therefore, the bit lines BL and $\overline{BL}$ are pre-charged to the high voltage level $V_{CC}$, and the level at the node $N_2$, in the dummy cell DMC, is changed to the low voltage level $V_{SS}$, which is called a stand-by status.

Generally, a semiconductor memory circuit must guarantee normal operation with a power source voltage range of $\pm 10\%$. Accordingly, when the high voltage level of the memory power source is designed to be 5 V, the semiconductor memory circuit must be designed so as to operate without any error even though the power source voltage changes within the range between 4.5 V and 5.5 V. Returning to FIG. 2, the graph depicts, for example, a case where first information "0" has been written, during a condition of $V_{CC}=4.5$ V, in the memory cell, i.e. the level at the node $N_1$ is changed to the level $V_{SS}$; second the written information "0" is read from the memory cell MC at the time $t_2$, however, a voltage change has occurred during the stand-by status, particularly during the period from $t_0$ to $t_1$, from the level 4.5 V to 5.5 V. As is known, the capacitance of the dummy capacitor $C_D$ and the capacitance of the memory cell $C_S$ are determined so as to satisfy the following equation (1).

$$C_D = \tfrac{1}{2} C_S \tag{1}$$

(Note the symbols $C_D$ and $C_S$ also denote the capacitances of respective capacitors $C_D$ and $C_S$.)

If the power source voltage level is maintained at 4.5 V up to and after the time $t_2$, contrary to the graph in FIG. 2, each voltage drop, produced in the bit lines BL and $\overline{BL}$, is respectively expressed by about $$V_{CC}\frac{C_D}{C_B} \text{ and } V_{CC}\frac{C_S}{C_B},$$

according to the equation (1) above. That is, when the word line WL is activated (the dummy word line DWL is also activated), current flows from the bit lines BL and $\overline{BL}$ into, respectively the capacitors $C_S$ and $C_D$, via the nodes $N_1$ and $N_2$, and thus the voltage levels of the bit lines BL and $\overline{BL}$ are reduced by about the values of the aforesaid expressions $$V_{CC}\frac{C_D}{C_B} \text{ and } V_{CC}\frac{C_S}{C_B}.$$

Accordingly, the voltage level $V_{\overline{BL}}$ of the bit line $\overline{BL}$ and the voltage level $V_{BL}$ of the bit line BL are respectively expressed by equations (2) and (3).

$$V_{\overline{BL}} = V_{CC} - V_{CC}\frac{C_D}{C_B} = 4.5 - 4.5\frac{C_D}{C_B} \tag{2}$$

$$= 4.5 - \frac{4.5}{2}\frac{C_S}{C_B}$$

$$V_{BL} = V_{CC} - V_{CC}\frac{C_S}{C_B} = 4.5 - 4.5\frac{C_S}{C_B} \tag{3}$$

From equations (2) and (3) above, the voltage difference $\Delta V_{BL}$, between the voltages of the bit lines BL and $\overline{BL}$, can be expressed by equation (4).

$$\Delta V_{BL} = |V_{BL} - V_{\overline{BL}}| = 2.25\frac{C_S}{C_B} \text{ (V)} \tag{4}$$

However, in FIG. 2, a voltage change by the power source occurs during the period $t_0$ through $t_1$ and the increased voltage 5.5 is maintained thereafter. In such a situation, the voltage level $(V_{N1})$ at the node $N_1$ is pushed upward, via the capacitor $C_S$, by the aforesaid voltage increase of 1 $(=5.5-4.5)$ V. Thus, the voltage levels $V_{\overline{BL}}$ and $V_{BL}$ of the bit lines $\overline{BL}$ and BL, respectively, are expressed by equations (5) and (6).

$$V_{\overline{BL}} = V_{CC} - V_{CC}\frac{C_D}{C_B} = 5.5 - 5.5\frac{C_D}{C_B} \tag{5}$$

$$= 5.5 - \frac{5.5}{2}\frac{C_S}{C_B}$$

$$V_{BL} = V_{CC} - (V_{CC} - V_{N1})\frac{C_S}{C_B} = V_{CC} - (V_{CC} - 1.0)\frac{C_S}{C_B} \tag{6}$$

$$= 5.5 - 4.5\frac{C_S}{C_B}$$

As a result, the difference voltage $\Delta V_{BL}$, during the read operation after the time $t_2$, is reduced as defined by equation (7).

$$\Delta V_{BL} = |V_{BL} - V_{\overline{BL}}| = 1.75\frac{C_S}{C_B} \tag{7}$$

It should be understood that, in the circuit of FIG. 1, the above mentioned reduction of the voltage level (refer to the change in the equations (4) to (7) above) cannot occur during the read operation of the information "1". The reason is as follows. When the information "1" is to be written into the memory cell MC, the voltage level at the node $N_1$ is changed to the level of $V_{CC}$. Therefore, when the above write operation finishes, the voltage level at the node $N_1$ is equal to 4.5 V. If the voltage increase to 5.5 V occurs thereafter, the voltage level at the node $N_1$ is pushed upward, via the capacitor $C_S$, to 5.5 V. Under such circumstance, no charges leave the bit line BL during the read operation of the information "1", but charges, proportional to the value of $\tfrac{1}{2} C_S$, leave the bit line $\overline{BL}$, which operation is the same as the usual read operation when there is no change in the power source voltage. The reference symbol $V_{ref}$ indicates a threshold voltage level utilized for distinguishing between the "1" level and the "0" level.

Figure 3:
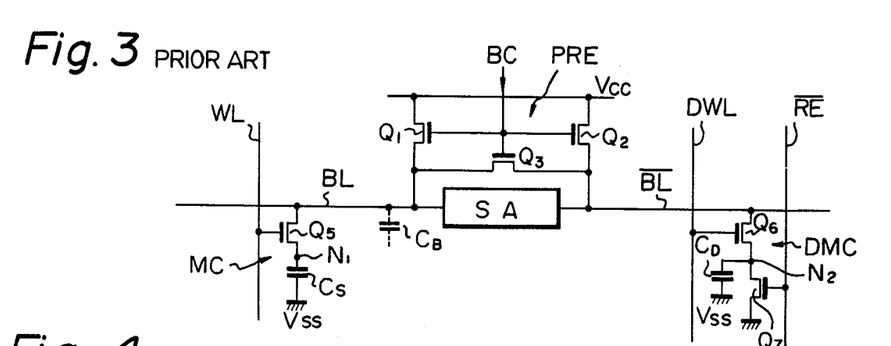
FIG. 3 illustrates a circuit diagram of a conventional one-transistor storage cell type RAM circuit.
Figure 4:
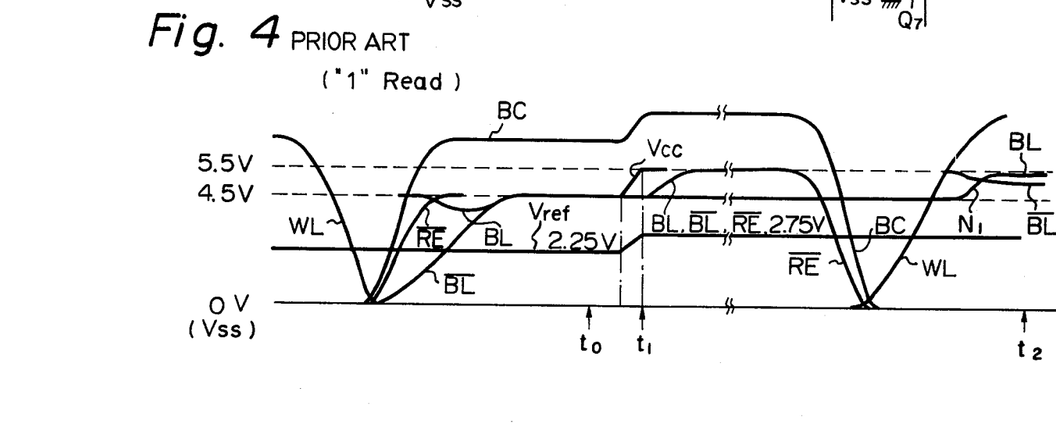
FIG. 4 is a graph, used for explaining the operation of the circuit illustrated in FIG. 3.

As mentioned above, since the capacitors $C_S$ and $C_D$ are energized, at each one electrode thereof, by the voltage level $V_{CC}$, the above mentioned voltage reduction $$\left(2.25 \frac{C_S}{C_B} \longrightarrow 1.75 \frac{C_S}{C_B}\right)$$

is induced during the "0" read operation. However, the voltage level $V_{CC}$, at the capacitors $C_S$ and $C_D$ of FIG. 1, can be replaced by the voltage level $V_{SS}$ through a manufacturing process in which, for example impurities are injected, through an ion implantation process, into the areas located under the capacitors $C_S$ and $C_D$, where the impurities have a conductivity type opposite to that of the substrate. If the voltage level $V_{CC}$ at the capacitors $C_S$ and $C_D$ is replaced by the voltage level $V_{SS}$, there is a possibility that no voltage level change at the node $N_1$ will occur regardless of the power source voltage changes. FIG. 3 illustrates a circuit diagram of a conventional one-transistor storage cell type RAM circuit. In the circuit of FIG. 3, the above mentioned voltage $V_{SS}$ is employed instead of the voltage $V_{CC}$ at the capacitors $C_S$ and $C_D$. The circuit of FIG. 3 can overcome the voltage reduction of $\Delta V_{BL}$ during the "0" read operation, however, an identical voltage reduction of $\Delta V_{BL}$ is created during the "1" read operation. FIG. 4 is a graph, used for explaining the operation of the circuit shown in FIG. 3. This graph depicts the "1" read operation. First, the information "1" has been written in the memory cell MC under the condition where $V_{CC}=4.5$ V, second the change of the power source voltage occurs during the period from the time $t_0$ to $t_1$, that is the voltage $V_{CC}$ is increased from 4.5 V to 5.5 V. If the power source voltage level is maintained at 4.5 V up to and after the time $t_2$, contrary to the graph in FIG. 4, the voltage level $V_{\overline{BL}}$ is defined by equation (8).

$$V_{\overline{BL}} = V_{CC} - V_{CC}\frac{C_D}{C_B} = 4.5 - \frac{4.5}{2}\frac{C_S}{C_B} \tag{8}$$

Under such a circumstance, since the stored information "1" at the node $N_1$ is represented by 4.5 V, no charges are passed from the bit line BL to the node $N_1$ when the word line WL is activated, and thus equation (9) results.

$$V_{BL} = V_{CC} = 4.5 \text{ V} \tag{9}$$

From equations (8) and (9) above, the voltage difference $\Delta V_{BL}$ is expressed as follows.

$$\Delta V_{BL} = |V_{BL} - V_{\overline{BL}}| = 2.25\frac{C_S}{C_B} \tag{10}$$

The value $\Delta V_{BL}$ in equation (10) is the same as that in equation (4), and therefore, no voltage reduction is induced. However, if the power source voltage ($V_{CC}$) is increased, during the stand-by status as shown in FIG. 4, from 4.5 V to 5.5 V, the voltage level $V_{\overline{BL}}$ of the bit line $\overline{BL}$ is defined as follows.

$$V_{\overline{BL}} = V_{CC} - V_{CC}\frac{C_D}{C_B} = 5.5 - 5.5\frac{C_D}{C_B} \tag{11}$$

$$= 5.5 - \frac{5.5}{2}\frac{C_S}{C_D}$$

At this time, even though the voltage level $V_{CC}$ is increased to 5.5 V, the voltage level $V_{N1}$ at the node $N_1$ is maintained, that is 4.5 V, because the transfer-gate transistor $Q_5$ is now OFF. Therefore, current flows from the bit line BL to the memory cell MC and the voltage level $V_{BL}$ can be defined as follows.

$$V_{BL} = V_{CC} - (V_{CC} - V_{N1})\frac{C_S}{C_B} = 5.5 - (5.5 - 4.5)\frac{C_S}{C_B} \tag{12}$$

$$= 5.5 - \frac{C_S}{C_B}$$

Consequently, the voltage difference $\Delta V_{BL}$, at the time $t_2$ necessary for achieving the read operation, is defined as follows.

$$\Delta V_{BL} = |V_{BL} - V_{\overline{BL}}| = 1.75\frac{C_S}{C_B} \tag{13}$$

As understood from equations (7) and (13) above, the undesired voltage reduction of $\Delta V_{BL}$ is inevitable in each of the circuits illustrated in FIGS. 1 and 3.

Figures 5, 6:
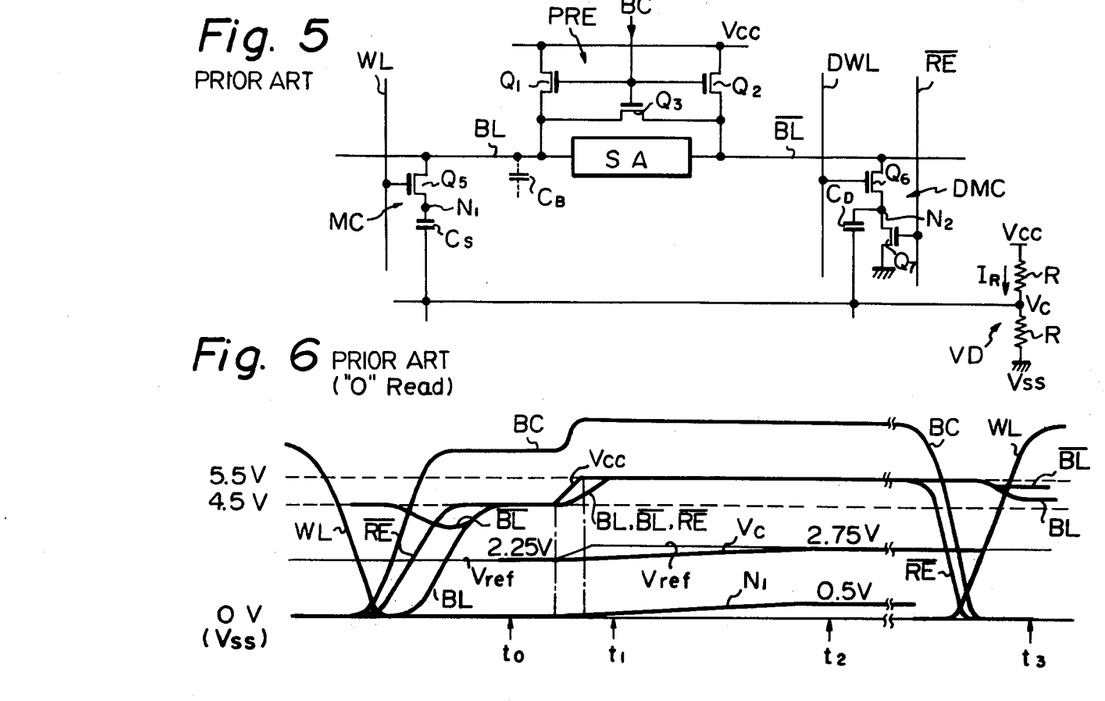
FIG. 5 illustrates a circuit diagram of a conventional one-transistor storage cell type RAM circuit which contains an improvement with respect to an undesired voltage reduction of $\Delta V_{BL}$.
FIG. 6 is a graph, used for explaining the "0" read operation of the circuit illustrated in FIG. 5.
Figure 7:
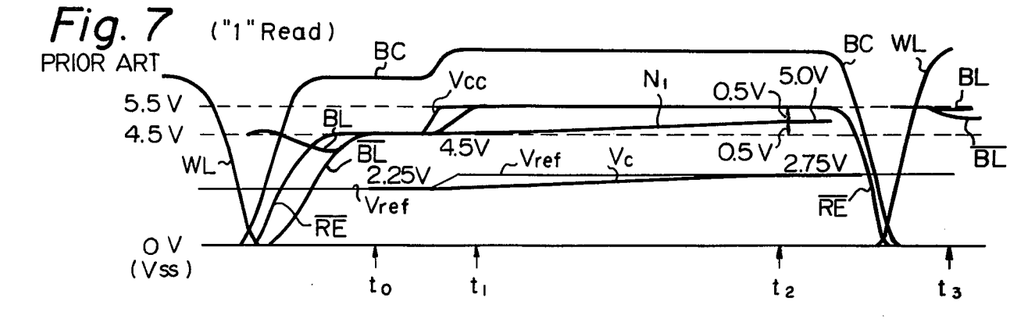
FIG. 7 is a graph, used for explaining the "1" read operation of the circuit illustrated in FIG. 5.

FIG. 5 illustrates a circuit diagram of a conventional one-transistor storage cell type RAM circuit which contains an improvement with respect to the undesired voltage reduction of $\Delta V_{BL}$. FIG. 6 is a graph, used for explaining the "0" read operations of the circuit shown in FIG. 5. FIG. 7 is a graph, used for explaining the "1" read operation of the circuit shown in FIG. 5. As seen from FIG. 5, the improvement is specifically represented by a voltage divider VD having two resistors R. The voltage divider VD produces an output voltage of $V_C$ which is equal to half of $V_{CC}$ ($V_C = \frac{1}{2} V_{CC}$). The voltage $V_C$ is applied to both the capacitors $C_S$ and $C_D$, at each first electrode thereof. In the circuit of FIG. 5, when the write operation of the information "0" is achieved at the condition where $V_{CC}=4.5$ V and the read operation thereof is also achieved at the condition where $V_{CC}=4.5$ V, the voltage difference $\Delta V_{BL}$, during the read operation, is determined by equation (14).

$$\Delta V_{BL} = 2.25\frac{C_S}{C_B} \tag{14}$$

If the power source voltage $V_{CC}$ changes from 4.5 V to 5.5 V during the period from the time $t_0$ to $t_1$, as illustrated in FIG. 6, and at the same time if the time $t_2$ is longer than the time $t_1$, equations (15) and (16) can be obtained, because the voltage level $V_C$ and the voltage level ($V_{N1}$) at the node $N_1$ change in such a manner as depicted in FIG. 6.

$$V_{\overline{BL}} = V_{CC} - V_{CC}\frac{C_D}{C_B} = 5.5 - 5.5\frac{C_D}{C_B} = \tag{15}$$

$$5.5 - \frac{5.5}{2}\frac{C_S}{C_B} = 5.5 - 2.75\frac{C_S}{C_B}$$

$$V_{BL} = V_{CC} - (V_{CC} - V_{N1})\frac{C_S}{C_B} = \tag{16}$$

$$5.5 - (5.5 - 0.5)\frac{C_S}{C_B} = 5.5 - 5\frac{C_S}{C_B}$$

Consequently, the voltage difference $\Delta V_{BL}$, at the time $t_2$ for achieving the read operation, is expressed as follows.

$$\Delta V_{BL} = |V_{BL} - V_{\overline{BL}}| = 2.25 \frac{C_S}{C_B} \quad (17)$$

It should be noted that equation (17) is identical to equation (14) and no voltage reduction of $\Delta V_{BL}$ is induced, which is also true in the case where the "1" read operation is conducted. That is, if the voltage level $V_{CC}$ is kept constant at 4.5 V, the voltage difference $\Delta V_{BL}$ is expressed by equation (18).

$$\Delta V_{BL} = 2.25 \frac{C_S}{C_B} \quad (18)$$

Similarly, even though the voltage level $V_{CC}$ changes during the period from time $t_0$ to $t_1$, if the read time $t_2$ is far longer than the time $t_2$, equations (19) and (20) result.

$$V_{\overline{BL}} = V_{CC} - V_{CC} \frac{C_D}{C_B} = 5.5 - \frac{5.5}{2} \frac{C_S}{C_B} \quad (19)$$

$$V_{BL} = V_{CC} - (V_{CC} - V_{N1}) \frac{C_S}{C_B} = \quad (20)$$

$$5.5 - (5.5 - 5) \frac{C_S}{C_B} = 5.5 - 0.5 \frac{C_S}{C_B}$$

From equations (19) and (20), the voltage difference $\Delta V_{BL}$ at the time $t_2$ includes no undesired voltage reduction, as represented by equation (21).

$$\Delta V_{BL} = |V_{BL} - V_{\overline{BL}}| = 2.25 \frac{C_S}{C_B} \quad (21)$$

Equation (21) is identical to equation (18) above.

The circuit of FIG. 5 is satisfactory from the point of view represented by the equations (17), (18) and (21), however, it has the following defects. The resistance value of each of the resistors R in FIG. 5 must be increased so as to reduce the power consumption produced by the resistors R. However, since the resistance value thereof is large, the voltage $V_C$ cannot quickly follow the change in $V_{CC}$. Accordingly, if the time $t_2$ is closed to the time $t_1$, the value of $\Delta V_{BL}$ becomes small. For example, in a large capacity RAM which is on the order of 64k bits, the capacitance, developed at the middle junction of resistors R in the voltage divider VD becomes about 1000 pF. While, if the resistance value of the resistor R is determined to be $2R=50k\Omega$, the amount of current $I_R$ is suppressed below 0.1 mA. Then the time constant $\tau$ for a change of $V_C$, when the voltage level $V_{CC}$ changes, is determined as follows. That is, $\tau = 2R \cdot C = 50 \mu S$, which an extremely large value. Due to the presence of such a large time constant $\tau$ for $V_C$, if the read operation is commenced immediately after the time $t_1$, the voltage difference $\Delta V_{BL}$ is reduced as defined by the following equation (22).

$$\Delta V_{BL} = 1.75 \frac{C_S}{C_B} \quad (22)$$

Equation (22) is identical to equation (13) above.

Figure 8:
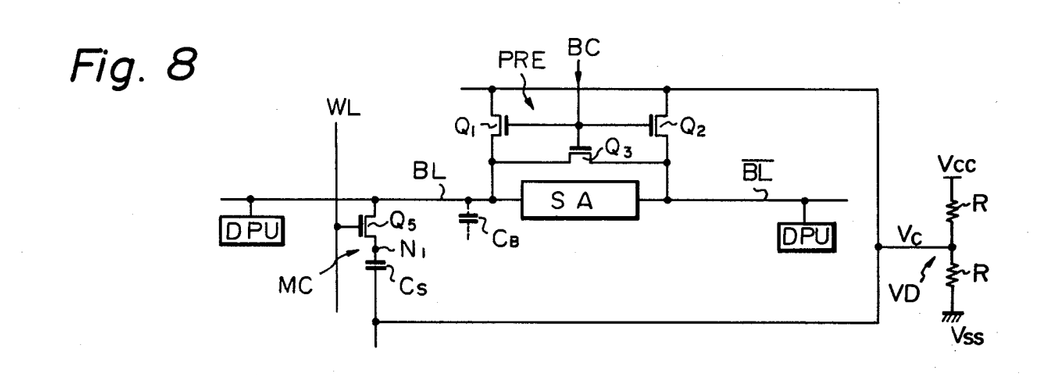
FIG. 8 illustrates a circuit diagram of an embodiment representing the semiconductor memory circuit according to the present invention.
Figure 9:
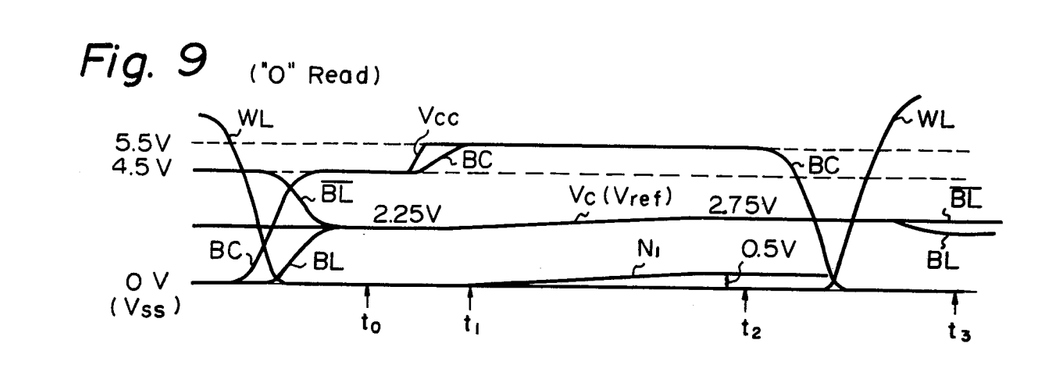
FIG. 9 is a graph, used for explaining the "0" read operation of the circuit illustrated in FIG. 8.
Figure 10:
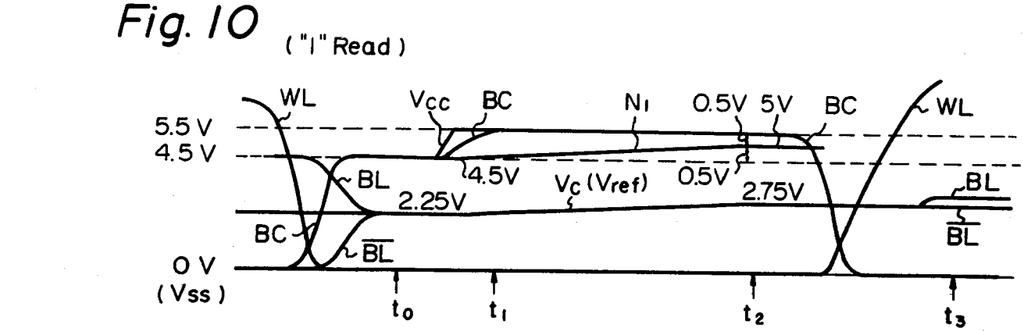
FIG. 10 is a graph, used for explaining the "1" read operation of the circuit illustrated in FIG. 8.

The present invention can improve the reduction of the voltage difference $\Delta V_{BL}$ represented by equation (22), so that the voltage difference $\Delta V_{BL}$ is always kept at a constant large value even if the change in the power source voltage occurs at any time. The basic construction of the present invention is described as follows. That is, a first circuit is employed for supplying a pre-charge voltage to the pre-charge circuit PRE, the level of that pre-charge voltage is defined as in the middle between the high voltage level and the low voltage level, developed at the bit line, and also a second circuit is employed for supplying a predetermined voltage to the capacitor $C_S$ at the second electrode thereof. Preferably, said predetermined voltage to be supplied from said second circuit is exactly the same as the voltage to be supplied from said first circuit, the level of which voltage is defined as in the middle between the high voltage level and the low voltage level developed at the bit line. FIG. 8 illustrates a circuit diagram of an embodiment representing the semiconductor memory circuit according to the present invention. FIG. 9 is a graph, used for explaining the "0" read operation of the circuit shown in FIG. 8. And, FIG. 10 depicts a graph, used for explaining the "1" read operation of the circuit shown in FIG. 8. As mentioned above, the circuit of the present invention contains the aforesaid first circuit and the second circuit. The first circuit supplies the pre-charge voltage to the pre-charge circuit PRE. The second circuit supplies a predetermined voltage to the capacitor $C_S$, at the second electrode thereof. The term "second electrode" has already been explained with reference to FIG. 1. Preferably, the predetermined voltage from the second circuit is exactly the same as the voltage from the first circuit. Further, the output voltages from said first and second circuits are defined as in the middle between the high voltage level developed at the bit line and the low voltage level developed at the same bit line. Furthermore, said high voltage level and low voltage level may be selected to be, respectively, the $V_{CC}$ and $V_{SS}$ supplied by the memory power source. In this case, a dynamic pull-up circuit is necessary. Since the first and second circuits produce the same output voltage, that is $\frac{1}{2}(V_{CC}-V_{SS})$, these circuits are fabricated as a single voltage divider. The circuit of FIG. 8 corresponds to a circuit which contains the above mentioned single voltage divider VD and the above mentioned dynamic pull-up circuits DPU. Referring to FIG. 8, this circuit is different in that of FIG. 5 from the following two aspects. First, the output voltage $V_C$ being equal to $\frac{1}{2}(V_{CC}-V_{SS})$ from the voltage divider VD, is also applied to the pre-charge circuit PRE. Second, the voltage level of both the bit lines BL and $\overline{BL}$, appearing during the stand-by status, becomes $\frac{1}{2}V_{CC}$, which level $\frac{1}{2} \cdot V_{CC}$ has been pre-charged by the circuit PRE, and accordingly, the voltage of the bit line $\overline{BL}$ can be utilized as the aforesaid reference voltage $V_{ref}$. This means that the dummy cell DMC can be removed from the circuits illustrated in FIGS. 1, 3 and 5, as shown in FIG. 8. In this case, the dynamic pull-up circuits DPU are connected to the bit lines BL and $\overline{BL}$. Although the dummy cell DMC is not illustrated in FIG. 8, this DMC can be left as it is, if necessary, because such cell is available for suppressing undesired noise.

Figure 11:
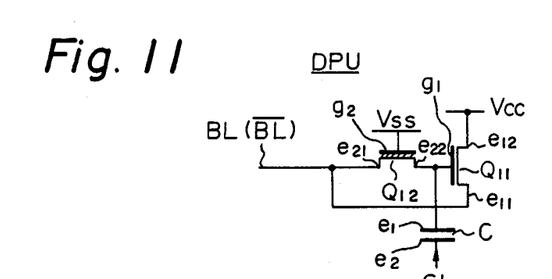
FIG. 11 illustrates one example of the dynamic pull-up circuit shown in FIG. 8.

FIG. 11 illustrates an example of the dynamic pull-up circuit shown in FIG. 8. The dynamic pull-up circuit DPU is connected to each of the bit lines BL and $\overline{BL}$ so as to connect the aforesaid high voltage level of $V_{CC}$ thereto. The circuit DPU comprises an enhancement type MIS transistor $Q_{11}$, having a gate g1, first and second electrodes e11 and e12, a depletion type MIS transistor $Q_{12}$, having a gate g2, and first and second electrodes e21 and e22. The dynamic pull-up circuit also includes a capacitor C, having a first electrode e1 and a second electrode e2 which receive a clock pulse CL. The first electrodes e11 and e21 of both said MIS transistors are connected with the bit line BL ($\overline{BL}$). The second electrode e22 of the depletion type MIS transistor, the gate g1 of the enhancement type MIS transistor and the first electrode e1 of the capacitor are commonly connected together. The gate g2 of the depletion type MIS transistor receives the voltage $V_{SS}$ and the second electrode e12 of the enhancement type MIS transistor receives the voltage $V_{CC}$. When the clock signal or pulse CL is supplied, the voltage level at the gate g1 is pushed upward above the voltage level $V_{CC}$ by a bootstrap effect. However, this bootstrap effect becomes effective only when the voltage level of the bit line BL (or $\overline{BL}$) is high. If the voltage level is low, current flows through the transistor $Q_{12}$, and accordingly the voltage level at the gate g1 does not increase. As a result, if the voltage level of the bit line is high, the transistor $Q_{11}$ is turned ON and the bit line is charged toward the level $V_{CC}$, while, if the voltage level of the bit line is low, the transistor $Q_{11}$ is not turned ON and the bit line is not charged.

Returning to FIG. 8, after the write operation or refresh operation is performed with respect to the memory cell MC at the level $V_{CC}$ of 4.5 V, the voltage level is changed to $V_{SS}$, the voltage level of the bit line $\overline{BL}$ becomes 4.5 V and the voltage level of the bit line BL becomes 0 V, as shown in FIG. 9. Thereafter, the signal BC is activated and the transistors $Q_1$, $Q_2$ and $Q_3$ are turned ON. Then the charges on the bit line $\overline{BL}$ are distributed to the bit line BL and thereby the voltage level of each of the bit lines has the same value of 2.25 ($= \frac{1}{2} \times 4.5$) V. Thereafter the aforesaid stand-by status begins from the time $t_0$, in which the voltage level of each bit line cannot be changed by, for example a junction-leakage current due to the voltage divider VD, and the voltage level 2.25 V is maintained.

When the read operation is commenced, the word line WL is activated and the aforesaid voltage difference $\Delta V_{BL}$ between the bit lines BL and $\overline{BL}$ is created in accordance with the information stored in the memory cell MC. Next, the sense amplifier SA is driven so that the low voltage level of one of the bit lines is pulled down toward the level $V_{SS}$, while, the high voltage level of the other bit line is pulled up toward the level $V_{CC}$ by means of one of the corresponding dynamic pull-up circuits DPU. Thus, the voltage difference therebetween is considerably amplified. The amplified difference voltage is transferred, via a column line (not shown), to a read-write amplifier (not shown).

The operation of the circuit shown in FIG. 8 will be explained with reference to FIGS. 9 and 10.

(1) During a "0" read operation, if the voltage level is maintained at $V_{CC}=4.5$ V, the voltage level $V_{\overline{BL}}$ of the bit line $\overline{BL}$ does not change, because no dummy cell DMC exists as is illustrated in FIG. 8. Thus, equation (23) is obtained.

$$V_{\overline{BL}} = V_C = 2.25 \, V \tag{23}$$

While, the voltage level $V_{BL}$ of the bit line BL is expressed by equation (24).

$$V_{BL} = V_C - V_C \frac{C_S}{C_B} = 2.25V - 2.25 \frac{C_S}{C_B} \tag{24}$$

From equations (23) and (24) above, equation (25), with respect to the voltage difference, is obtained.

$$\Delta V_{BL} = |V_{BL} - V_{\overline{BL}}| = 2.25 \frac{C_S}{C_B} \tag{25}$$

(2) During a "0" read operation, if the voltage level $V_{CC}$ changes, during the stand-by status, from 4.5 V to 5.5 V and the read operation is commenced immediately after the time $t_1$, the result is the same as that mentioned in paragraph (1) above. This is because, close to the time $t_1$, as seen from FIG. 9, the voltage level at $N_1$ is about 0 V and the voltage level $V_C$ is kept at almost 2.25 V due to the presence of the aforementioned time constant $\tau$.

(3) During a "0" read operation, if the voltage level $V_{CC}$ changes from 4.5 V to 5.5 V and the read operation is commenced at the time $t_2$ being far longer than the time $t_1$, $$V_{\overline{BL}} = V_C = \frac{5.5}{2} = 2.75V \tag{26}$$

$$V_{BL} = V_C - (V_C - V_{N1}) \frac{C_S}{C_B} \tag{27}$$

$$= 2.75 - (2.75 - 0.5) \frac{C_S}{C_B}$$

$$= 2.75 - 2.25 \frac{C_S}{C_B}$$

From equations (26) and (27), equation (28) is obtained.

$$\Delta V_{BL} = |V_{BL} - V_{\overline{BL}}| = 2.25 \frac{C_S}{C_B} \tag{28}$$

(4) During a "1" read operation, if the voltage level is maintained at $V_{CC}=4.5$ V, equations (29) and (30) are obtained, with respect to the bit lines $\overline{BL}$ and BL.

$$V_{\overline{BL}} = V_C = 2.25V \tag{29}$$

$$V_{BL} = V_C + (V_{CC} - V_C) \frac{C_S}{C_B} \tag{30}$$

$$= 2.25 + (4.5 - 2.25) \frac{C_S}{C_B}$$

$$= 2.25 + 2.25 \frac{C_S}{C_B}$$

From equations (29) and (30), equation (31) is obtained.

$$\Delta V_{BL} = |V_{BL} - V_{\overline{BL}}| = 2.25 \frac{C_S}{C_B} \tag{31}$$

(5) During a "1" read operation, if the voltage level $V_{CC}$ varies, during the stand-by status, from 4.5 V to 5.5 V and the read operation is commenced immediately after the time $t_1$, the voltage level $V_C$ is held at about 2.25 V and the voltage level at the node $N_1$ is held at about 4.5 V, the result is the same as that mentioned in paragraph (4) above.

(6) During a "1" read operation, if the voltage level $V_{CC}$ changes from 4.5 V to 5.5 V and the read operation is commenced at the time $t_2$ being far longer than the time $t_1$, equations (32) and (33) are obtained.

$$V_{\overline{BL}} = V_C = \frac{5.5}{2} = 2.75V \quad (32)$$

$$V_{BL} = V_C + (V_{CC} - 0.5 - V_C)\frac{C_S}{C_B} \quad (33)$$

$$= 2.75 + (5.5 - 0.5 - 2.75)\frac{C_S}{C_B}$$

$$= 2.75 + 2.25\frac{C_S}{C_B}$$

From equations (32) and (33), equation (34) is obtained.

$$\Delta V_{BL} = |V_{BL} - V_{\overline{BL}}| = 2.25\frac{C_S}{C_B} \quad (34)$$

The cases, mentioned in the paragraphs (2), (3), (5) and (6) above correspond to all possible cases, in which, first the "0" write or "1" write operation has been performed in the memory cell MC under a condition where $V_{CC}=4.5$ V. In such cases, the aforesaid results, corresponding to equations (28) and (34), are identical, corresponding to the equations (25) and (31) which are obtained in the cases where the read operations are commenced under a condition where $V_{CC}=4.5$ V (not 5.5 V).

As explained above, one of the previously mentioned two defects can be overcome. That is, read error, due to a voltage change in the memory power source, can be eliminated. Further, three new advantages are produced, first no dummy cell DMC is required for constructing RAM, the second a high speed read operation is expected, because the read operation can be commenced immediately after the time $t_1$, and third power consumption can be reduced in the RAM, because a very large resistance value for each of the resistors R in the voltage divider VD is allowed.

Figure 14:
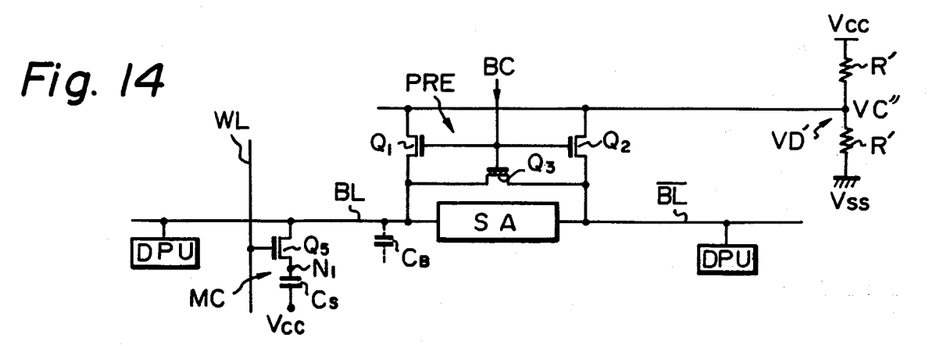
FIG. 14 illustrates a circuit diagram of another embodiment representing the semiconductor memory circuit according to the present invention; and, FIG. 15 is a graph, used for explaining the change of $V_{BB}$, obtained by using the semiconductor memory circuit illustrated in FIG. 14.

The present invention can overcome the other previously mentioned defect in which an error in a RAM system often occurs due to change in level of the backgate voltage ($V_{BB}$) for biassing the subtrate, in which the change in $V_{BB}$ is necessarily created in accordance with the voltage change developed in the bit lines BL and $\overline{BL}$. The circuit construction according to the present invention, especially the aforementioned first circuit, is very useful for suppressing the change in the backgate voltage $V_{BB}$. The first circuit, as mentioned above, functions to supply a pre-charge voltage to the pre-charge circuit PRE, and the pre-charge voltage is defined as in the middle between the levels $V_{CC}$ and $V_{SS}$. In this case, the previously mentioned second circuit, according to the present invention, functions to supply a predetermined voltage to the capacitor $C_S$, i.e. to its second electrode. The predetermined voltage may be chosen from a voltage having the level $V_{CC}$, $V_{SS}$ or $\frac{1}{2}$ ($V_{CC}-V_{SS}$). In FIG. 14, which will be explained hereinafter, the first circuit is illustrated as a voltage divider VD' having two resistors R'.

Figure 12:
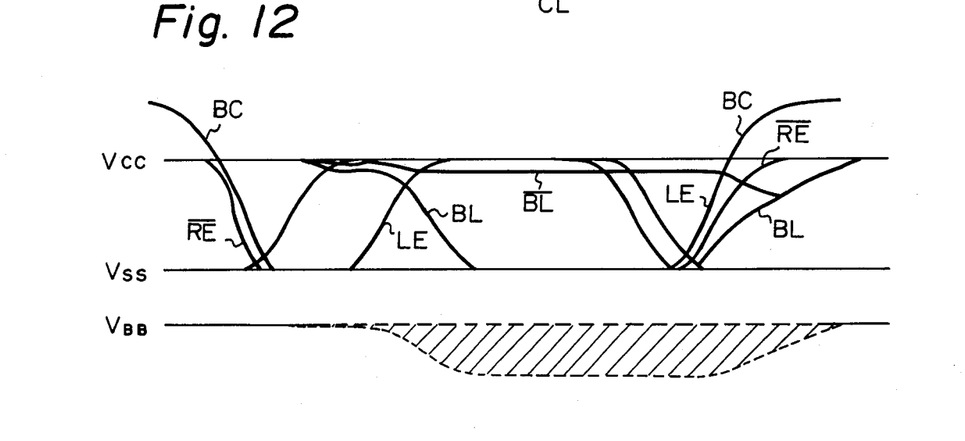
FIG. 12 is a first graph, used for explaining the change of $V_{BB}$, where the first graph is obtained when the voltage level $V_{BB}$ may change in proportion to the voltage of the line $\overline{BL}$.

FIG. 12 is a first graph, used for explaining the change of $V_{BB}$. The first graph is obtained when the semiconductor memory circuit having a circuit diagram as in FIG. 1 or FIG. 3 is used. In the first graph of FIG. 12, the meanings of respective reference symbols have already been explained. In the graph, the change in the backgate voltage $V_{BB}$ should be noted, which change is indicated by the hatched lines surrounded by broken lines. The reason why the voltage $V_{BB}$ changes in such a wide range is illustrated in FIG. 12, will be explained hereinafter. The backgate voltage, that is, the voltage of the substrate $V_{BB}$, was determined in the prior art, by an external biassing voltage generator. However, in recent years, the RAM system does not operate with such an external biassing voltage generator, but, an identical biassing voltage is generated in the RAM system itself, by using a single power source of 5 V ($V_{CC}$). In this case, it is difficult to generate a high power biassing voltage, compared to that of the external biassing voltage generator, and accordingly a low power biassing voltage is generated therein. To make matters worse, because the bit lines BL and $\overline{BL}$ are fabricated by diffusion layers, a great amount of PN-junction capacitance is created between the bit lines and the substrate. As a result, if a big change in the voltage level occurs in either one of the bit lines, this change of voltage is transmitted directly to the substrate, via the above mentioned large PN-junction capacitance. This is the reason why a large change in $V_{BB}$ occurs. For example, in FIG. 12, the voltage level $V_{BB}$ changes proportionally to the voltage change of the bit line BL. If such large voltage change occurs in the bit line $\overline{BL}$, the voltage level $V_{BB}$ may change in proportion to the voltage of the line $\overline{BL}$.

Figure 13:
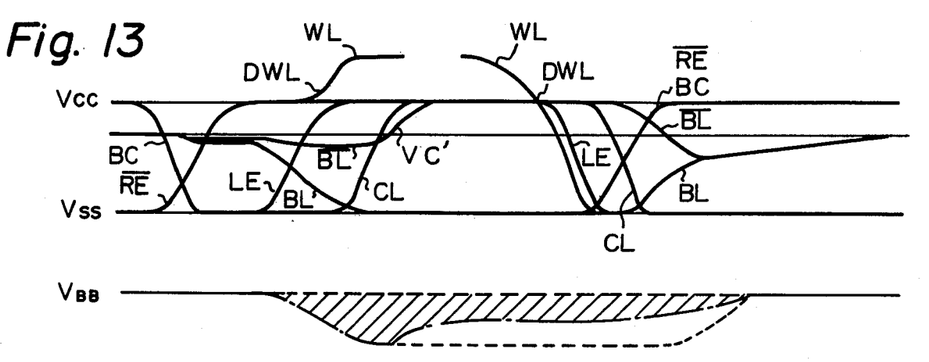
FIG. 13 is a second graph, used for explaining the change of $V_{BB}$.

FIG. 13 is a second graph, used for explaining the change of $V_{BB}$. The second graph indicates an improvement with respect to the change of $V_{BB}$ shown in FIG. 12. As seen from FIG. 13, the change in $V_{BB}$ is indicated by the hatched lines surrounded by a chain-dotted line, and accordingly, the change in $V_{BB}$ shown in FIG. 12, also illustrated in FIG. 13 by a broken line, is relatively minimized. This is why the pre-charge voltage of both the bit lines BL and $\overline{BL}$ is reduced from the level $V_{CC}$ to the level $V_C'$ which is illustrated in FIG. 13.

Figure 15:
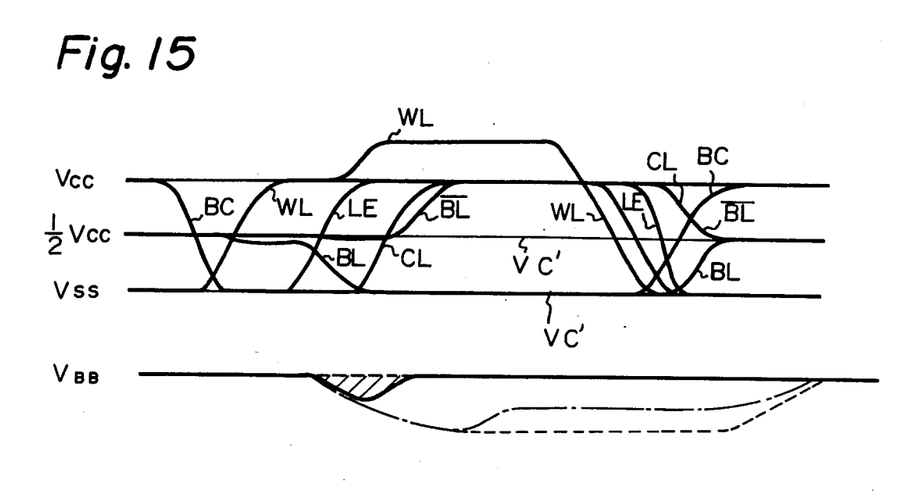

FIG. 14 illustrates a circuit diagram of another embodiment representing the semiconductor memory circuit according to the present invention. The previously explained circuit construction according to the present invention, especially the aforementioned first circuit, is very useful for suppressing changes in $V_{BB}$. The first circuit (VD'), as previously mentioned, functions to supply the pre-charge voltage ($V_C''$) to the pre-charge circuit PRE, and the pre-charge voltage is defined as in the middle between the levels $V_{CC}$ and $V_{SS}$. In this case, the previously mentioned second circuit, according to the present invention, functions to supply a predetermined voltage to the capacitor $C_S$, i.e. to its second electrode. The predetermined voltage may be chosen from a voltage having the level $V_{CC}$, $V_{SS}$ or $\frac{1}{2}$ ($V_{CC}-V_{SS}$), but in FIG. 14, the level $V_{CC}$ is chosen. In the circuit of FIG. 14, since the voltage level $V_C''$ is determined to be $\frac{1}{2}$ ($V_{CC}-V_{SS}$), the change in $V_{BB}$, caused by an upward voltage shift of one bit line, is almost cancelled by the change in $V_{BB}$, caused by a downward voltage shift of the other bit line. This will be clarified with reference to FIG. 15. FIG. 15 is a graph, used for explaining the change of $V_{BB}$, obtained by using the semiconductor memory circuit shown in FIG. 14. In FIG. 15, the change in $V_{BB}$ is indicated by the hatched lines surrounded by a solid line, and accordingly, the change in $V_{BB}$ illustrated in FIGS. 12 and 13, and also illustrated in FIG. 15 by a broken line and a chain-dotted line, is considerably minimized.

As mentioned above, the present invention can overcome the aforesaid two defects, and accordingly first the read error, due to the change in the memory power source, cannot occur, and second the change of $V_{BB}$ in the substrate can be stabilized. At the same time, the following three advantages are produced, first no dummy cell is required, second a high speed read operation can be achieved and last the power consumption in the voltage divider VD can be reduced.

I claim:

1. A semiconductor memory circuit, comprising:
   a plurality of word lines;
   a plurality of bit line pairs;
   a plurality of memory cells, each one of the memory cells operatively connected at corresponding ones of cross points of the word lines and the bit lines, each memory cell comprising:
   a capacitor having a first electrode and a second electrode as a pair of electrodes; and
   a transfer-gate transistor operatively connected to the corresponding bit line and in series with the capacitor at the first electrode thereof;
   a plurality of pre-charge circuits, one of the pre-charge circuits operatively connected to each bit line pair, each charging the corresponding bit line pair to a predetermined pre-charge voltage level;
   amplifying means including a plurality of sense amplifiers, each one of the sense amplifiers operatively connected to each bit line pair, for amplifying the voltage level difference between the corresponding bit line pair to develop a high voltage level and a low voltage level in accordance with the charge stored in each corresponding capacitor;
   a circuit, operatively connected to the pre-charge circuits, for supplying the pre-charge voltage to the pre-charge circuits, the level of the pre-charge voltage being in the middle between the high voltage level and the low voltage level; and
   supply means, operatively connected to each capacitor, for supplying a predetermined voltage to each capacitor at the second electrode thereof.

2. A semiconductor memory circuit as set forth in claim 1, wherein said predetermined voltage supplied from said second circuit is the same as the pre-charge voltage supplied from said first circuit, the level of the pre-charge voltage is in the middle between the high voltage level and the low voltage level developed at the bit line.

3. A semiconductor memory circuit as set forth in claim 2, wherein both said first and second circuit comprise a voltage divider.

4. A semiconductor memory circuit as set forth in claim 3, wherein said semiconductor memory circuit has operatively connectable thereto first and second voltage levels, and wherein said high voltage level and low voltage level, developed at the bit line, are selected to be the levels of the first voltage level and the second voltage level, respectively.

5. A semiconductor memory circuit as set forth in claim 4, wherein said voltage divider divides a voltage difference between the first voltage level and the second voltage level.

6. A semiconductor memory circuit as set forth in claim 5, wherein said amplifying means further comprises dynamic pull-up circuits, one of the dynamic pull-up circuits operatively connected to each bit line to pull the voltage levels of the respective bit lines to the level of the first voltage level.

7. A semiconductor memory circuit as set forth in claim 6,
   wherein said semiconductor memory circuit is operatively connected to receive a clock pulse, and
   wherein said dynamic pull-up circuit comprises:
   an enhancement type transistor having a gate, and first and second electrodes;
   a depletion type transistor having a gate and first and second electrodes; and
   a capacitor having a first electrode and a second electrode which receives the clock pulse,
   the first electrodes of both said enhancement and depletion type transistors are operatively connected to one of the bit lines, the second electrode of the depletion type transistor, the gate of the enhancement type transistor and the first electrode of the capacitor are commonly connected together, and the gate of the depletion type transistor receives the second voltage level and the second electrode of the enhancement type transistor receives the first voltage level.

8. A semiconductor memory circuit, comprising:
   a memory cell;
   a first dynamic pull-up circuit operatively connected to said memory cell;
   a sense amplifier operatively connected to said memory cell;
   a second dynamic pull-up circuit operatively connected to said sense amplifier, one of said first and second dynamic pull-up circuits at a time performing a pull-up operation to generate a first voltage level;
   a pre-charging circuit operatively connected to said sense amplifier and said first and second dynamic pull-up circuits; and
   a voltage divider, operatively connected to said pre-charging circuit and said memory cell, for providing a second voltage level lower than said first voltage level.

9. A semiconductor memory circuit as set forth in claim 8, wherein said semiconductor memory circuit has first and second reference voltages applied thereto and is operatively connectable to receive a clock signal, and wherein said first and second dynamic pull-up circuits each comprise:
   a first transistor operatively connected to said sense amplifier and the second reference voltage;
   a second transistor operatively connected to said sense amplifier, said first transistor and the first reference voltage; and
   a capacitor operatively connected to said first and second transistors and operatively connectable to receive the clock signal.

10. A semiconductor memory device as set forth in claim 9, wherein said pre-charging circuit comprises:
    a third transistor operatively connected to said sense amplifier and said voltage divider;
    a fourth transistor operatively connected to said third transistor, said sense amplifier and said voltage divider;
    a fifth transistor operatively connected to said third and fourth transistors, and
   wherein said voltage divider comprises:
    a first resistor operatively connected to the first reference voltage, said capacitor of said memory cell and said third and fourth transistors of said pre-charging circuit; and a second resistor operatively connected to the second reference voltage and to said first resistor.

11. A semiconductor memory device as set forth in claim 8, wherein said pre-charging circuit comprises:
   a first transistor operatively connected to said sense amplifier and said voltage divider;
   a second transistor operatively connected to said first transistor, said sense amplifier and said voltage divider; and
   a third transistor operatively connected to said first and second transistors.

12. A semiconductor memory device as set forth in claim 8, wherein said memory cell comprises:
   a first transistor operatively connected to said sense amplifier; and
   a capacitor operatively connected to said first transistor.

* * * * *

UNITED STATES PATENT AND TRADEMARK OFFICE
CERTIFICATE OF CORRECTION

PATENT NO. : 4,458,336

DATED : July 3, 1984

INVENTOR(S) : YOSHIHIRO TAKEMAE

It is certified that error appears in the above-identified patent and that said Letters Patent is hereby corrected as shown below:

Column 1, line 25, change "biassing" to --biasing--.

\*     Column 2, line 38, delete "of", second occurrence;
                line 57, delete ",".

Column 3, line 29, after "second", insert --,--.

Column 4, line 19, delete "a"; change "situation" to --case--.

Column 7, line 54, after "which", insert --is--.

Column 8, line 44, change "in" to --from--;
                line 45, change "from" to --in--.

Signed and Sealed this

Ninth Day of April 1985

[SEAL]

*Attest:*

DONALD J. QUIGG

*Attesting Officer*      *Acting Commissioner of Patents and Trademarks*